United States Patent
Kagiyama et al.

(10) Patent No.: US 7,609,070 B2
(45) Date of Patent: Oct. 27, 2009

(54) MANUFACTURING METHOD AND CONTROLLING METHOD OF ELECTRONIC DEVICE

(75) Inventors: Tomohiro Kagiyama, Yamanashi (JP); Yasuhiro Tosaka, Yamanashi (JP); Norikazu Iwagami, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 63 days.

(21) Appl. No.: 11/902,392

(22) Filed: Sep. 21, 2007

(65) Prior Publication Data
US 2008/0074119 A1    Mar. 27, 2008

(30) Foreign Application Priority Data
Sep. 25, 2006    (JP)    ............... 2006-258933

(51) Int. Cl.
G01R 31/12    (2006.01)
G01R 31/08    (2006.01)
G01R 31/26    (2006.01)

(52) U.S. Cl. ............ 324/548; 324/522; 438/17
(58) Field of Classification Search ......... 324/548, 324/522; 438/17
See application file for complete search history.

(56) References Cited

U.S. PATENT DOCUMENTS 5,337,272 A * 8/1994 Suwa et al. ............ 365/149
5,812,364 A * 9/1998 Oku et al. ............ 361/312
6,294,438 B1 * 9/2001 Arita et al. ............ 438/396
2003/0061694 A1 * 4/2003 Kamitani ............ 29/25.42

FOREIGN PATENT DOCUMENTS

| JP | 05-291575 A | 11/1993 |
| JP | 2001-274210 A | 10/2001 |
| JP | 2003-142588 A | 5/2003 |

OTHER PUBLICATIONS

Martin J. Brophy et al.; "MIM's the Word—Capacitors for Fun and Profit"; Proc. 2003 GaAs Mantech Conf., pp. 57-59.
Notification of Reason(s) for Refusal issued on Nov. 4, 2008 for corresponding Japanese Patent Application No. 2006-258933.

* cited by examiner

Primary Examiner—Amy He
(74) Attorney, Agent, or Firm—Westerman, Hattori, Daniels & Adrian, LLP (57) ABSTRACT

A manufacturing method of an electronic device includes applying a direct voltage having a first polarity to a capacitor that has an insulating layer including nitrogen and silicon as a capacitor dielectric layer, testing the capacitor to which the direct voltage having the first polarity is applied and determining a nondefective capacitor and a defective capacitor, and applying a direct voltage having a second polarity to the nondefective capacitor. The second polarity is opposite to the first polarity.

8 Claims, 8 Drawing Sheets

MANUFACTURING METHOD AND CONTROLLING METHOD OF ELECTRONIC DEVICE

BACKGROUND OF THE INVENTION

1. Field of the Invention

This invention generally relates to a manufacturing method and a controlling method of an electronic device, and in particular, relates to a manufacturing method and a controlling method of an electronic device that has a capacitor having a capacitor insulating layer including nitrogen and silicon as a dielectric layer.

2. Description of the Related Art

A capacitor is widely used in an electronic device. There is a capacitor that has an insulating layer including nitrogen and silicon such as a silicon nitride (SiN) layer or a silicon oxy-nitride (SiON) as a dielectric layer. This capacitor is, for example, formed on a compound semiconductor substrate, because the silicon nitride layer and the silicon oxy-nitride layer have a dielectric constant larger than that of a silicon oxide layer and these layers can be formed with a plasma CVD method at lower temperature. The capacitor is broken after a given time, when a voltage is applied to the capacitor.

As shown in Martin J. Brophy et al., "MIM's the Word—Capacitors for Fun and Profit", Proc. 2003 GaAs MANTECH Conf., pp. 57-59, United State, the time till the capacitor is broken depends on a voltage applied to the capacitor. The capacitor is broken at short times when the voltage applied to the capacitor is high. The capacitor is broken at long times when the voltage applied to the capacitor is low. There is an initially defective capacitor because of a problem like a defect in the dielectric layer. The initially defective capacitor is broken at shorter times compared to a time till which the normal capacitor is broken. The capacitor may be subjected to a screening test where the capacitor is subjected to a voltage not causing a normal capacitor to be broken, in order to eliminate the initially defective capacitor.

There is a demand for elongating the time (lifetime) till the capacitor is broken (out of order) with an operating voltage.

SUMMARY OF THE INVENTION

The present invention provides a manufacturing method and a controlling method of an electronic device that may elongate a lifetime of a capacitor.

According to an aspect of the present invention, preferably, there is provided a manufacturing method of an electronic device including applying a direct voltage having a first polarity to a capacitor that has an insulating layer including nitrogen and silicon as a capacitor dielectric layer, testing the capacitor to which the direct voltage having the first polarity is applied in order to determine a nondefective capacitor and a defective capacitor, and applying a direct voltage having a second polarity to the nondefective capacitor. The second polarity is opposite to the first polarity.

With the above-mentioned method, it is possible to recover a lifetime of the capacitor that is reduced because of the first polarity direct voltage application, when the direct voltage having the second polarity opposite to the first polarity is applied to the capacitor in order to determine the nondefective capacitor and the defective capacitor. It is therefore possible to elongate the lifetime of the capacitor.

The capacitor dielectric layer may be composed of SiN or SiON. The capacitor may be an MIS capacitor or an MIM capacitor. The direct voltage having the second polarity may be applied to the nondefective capacitor at a temperature under 200 degrees C.

According to another aspect of the present invention, preferably, there is provided a controlling method of an electronic device including a maintenance step of applying a direct voltage having a second polarity to a capacitor. The capacitor has an insulating layer including nitrogen and silicon as a capacitor dielectric layer. A direct voltage having a first polarity is applied to the capacitor in a test process. The second polarity is opposite to the first polarity.

With the above-mentioned method, it is possible to recover a lifetime of the capacitor that is reduced because of the test process, when the direct voltage having the second polarity opposite to the first polarity in the test process is applied to the capacitor. It is therefore possible to elongate the lifetime of the capacitor.

The maintenance step may be performed at least for a time same as that for which the direct voltage having the first polarity is applied to the capacitor. The capacitor may be used with an alternating-current voltage. The capacitor may be an MIS capacitor or an MIM capacitor.

According to another aspect of the present invention, preferably, there is provided a manufacturing method of an electronic device including in order: applying a direct voltage having a first polarity to a capacitor that has an insulating layer including nitrogen and silicon as a capacitor dielectric layer; applying a direct voltage having a second polarity to the capacitor, the second polarity being opposite to the first polarity; and testing the capacitor and determining a nondefective capacitor and a defective capacitor.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
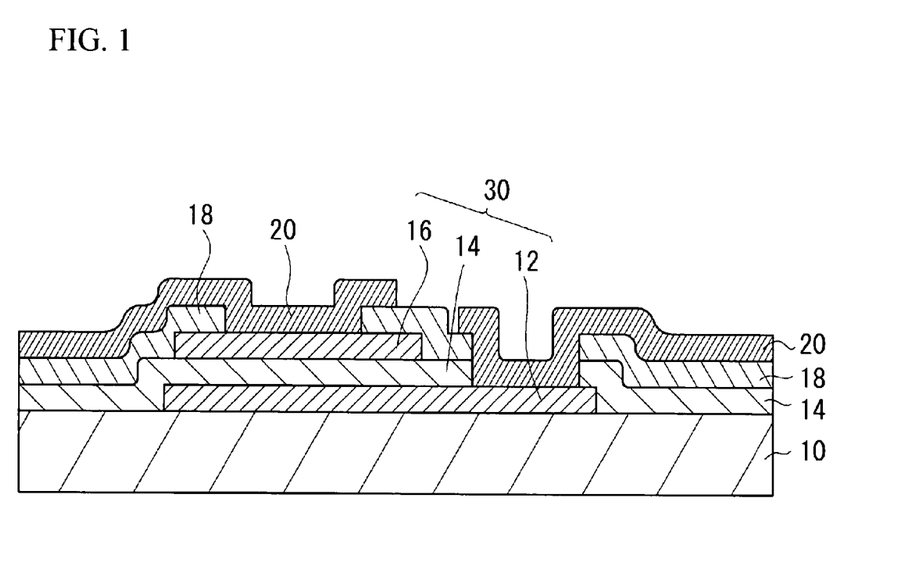
FIG. 1 illustrates a capacitor in accordance with a first embodiment.

A first embodiment is a case where a second voltage is applied after a screening test. FIG. 1 illustrates a structure of an MIM (Metal Insulator Metal) capacitor 30 having a silicon nitride layer. A lower electrode 12 is provided on a substrate 10 composed of GaAs or the like. A silicon nitride layer having a thickness of approximately 70 nm is provided as a capacitor dielectric layer 14 on the lower electrode 12. An upper electrode 16 is provided on the dielectric layer 14. The MIM capacitor 30 is composed of the lower electrode 12, the dielectric layer 14 and the upper electrode 16. A protective layer 18 composed of silicon nitride layer is formed so as to cover the MIM capacitor 30. A line 20 is provided on the protective layer 18 so as to be electrically coupled to the upper electrode 16 and the lower electrode 12.

The lower electrode 12, the upper electrode 16 and the line 20 are formed with a vapor deposition method, and are composed of Ti (titanium)/Pt (platinum)/Au (gold) of 100 nm/100 nm/300 nm. The lower electrode 12, the upper electrode 16 and the line 20 are composed of a metal. The lower electrode 12, the upper electrode 16 and the line 20 may be formed with a sputtering method, and may be composed of TiW (titanium tungsten)/Pt/Au of 100 nm/100 nm/300 nm. The dielectric layer 14 is formed with plasma CVD method and has a thickness of approximately 70 nm.

Figure 2:
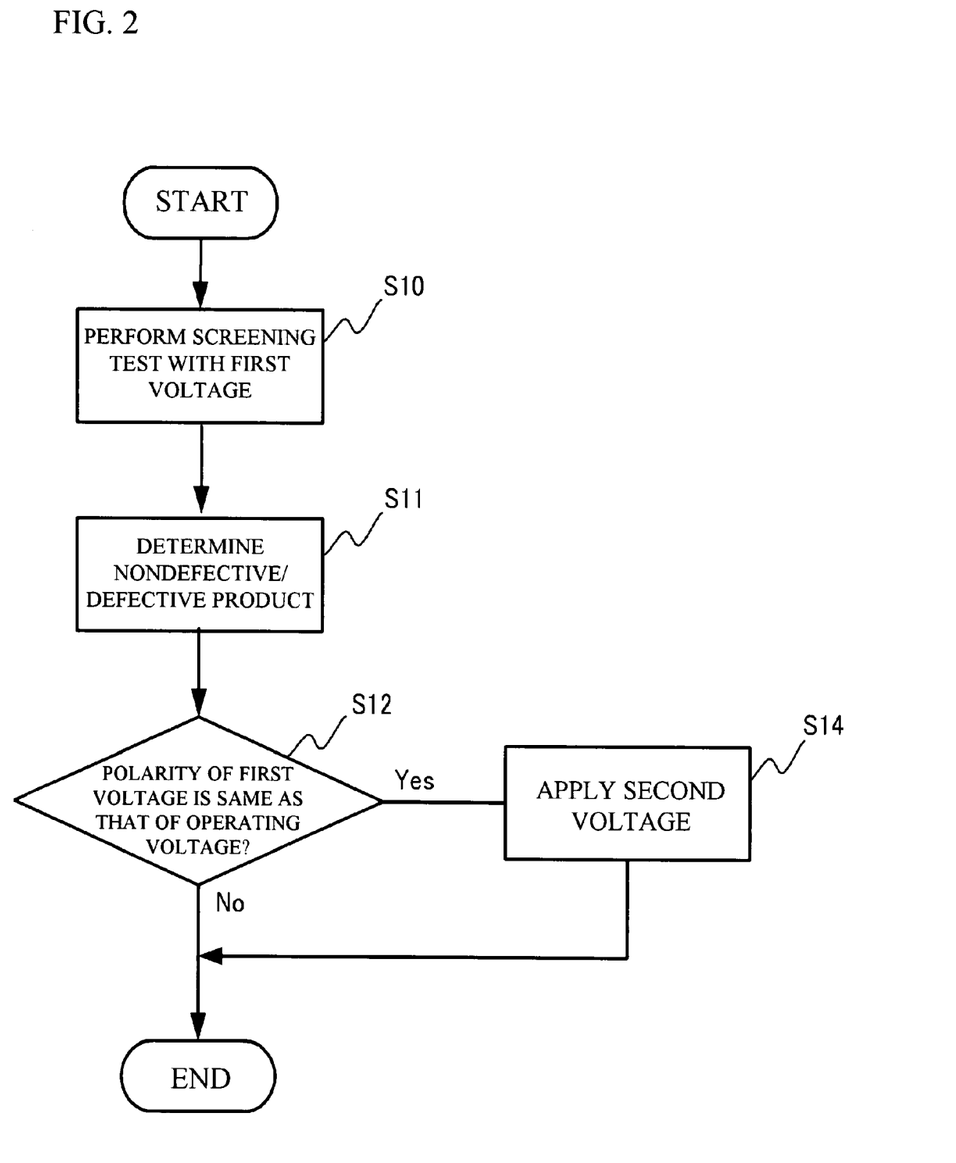
FIG. 2 illustrates a flow chart of a manufacturing method in accordance with a first embodiment.

FIG. 2 illustrates a flow chart of a manufacturing method in a case where an electronic device having the MIM capacitor shown in FIG. 1 is produced. A screening test is performed for selecting an initially defective MIM capacitor (initially defective product) after an MMIC (Monolithic Micro-wave Integrated Circuit) having the MIM capacitor is manufactured. A first voltage is applied in the screening test (Step S10). The first voltage is a first polarity direct voltage. Next, the capacitors to which the first voltage is applied are tested, and the capacitors are determined into a non-defective product and a defective product (Step S11). The defective product is, for example, eliminated. Step S12 is performed for the non-defective product. In Step S10, a voltage is applied in a short time. Therefore, the first voltage may be larger than an operating voltage and may be applied to the capacitor that is to be used actually. It is preferable that a temperature in Step S10 is a room temperature or a temperature higher than the room temperature.

It is determined whether the first polarity is same as a polarity of the operating voltage, with respect to the non-defective capacitor determined in Step S11 (Step S12). In a case where a positive voltage is applied to the lower electrode 12 as the operating voltage with respect to the upper electrode 16, the first polarity in the screening test is the same as that of the operating voltage when the electrical potential at the lower electrode 12 is positive with respect to that of the upper electrode 16; and the first polarity is opposite to that of the operating voltage when the electrical potential at the lower electrode 12 is negative with respect to that of the upper electrode 16. A second voltage is applied to the capacitor (Step S14) if it is determined "Yes" in Step S12. The second voltage is a direct voltage having a second polarity opposite to the first polarity. In this case, the second voltage is applied to the capacitor so that the electrical potential at the lower electrode 12 is negative with respect to the upper electrode 16. If it is determined "No" in Step S12, the process of the flow chart is terminated.

A description will be given of an advantage of application of the second voltage after the screening test. The second voltage has a polarity opposite to the first polarity of the first voltage applied in the screening test.

Figure 3:
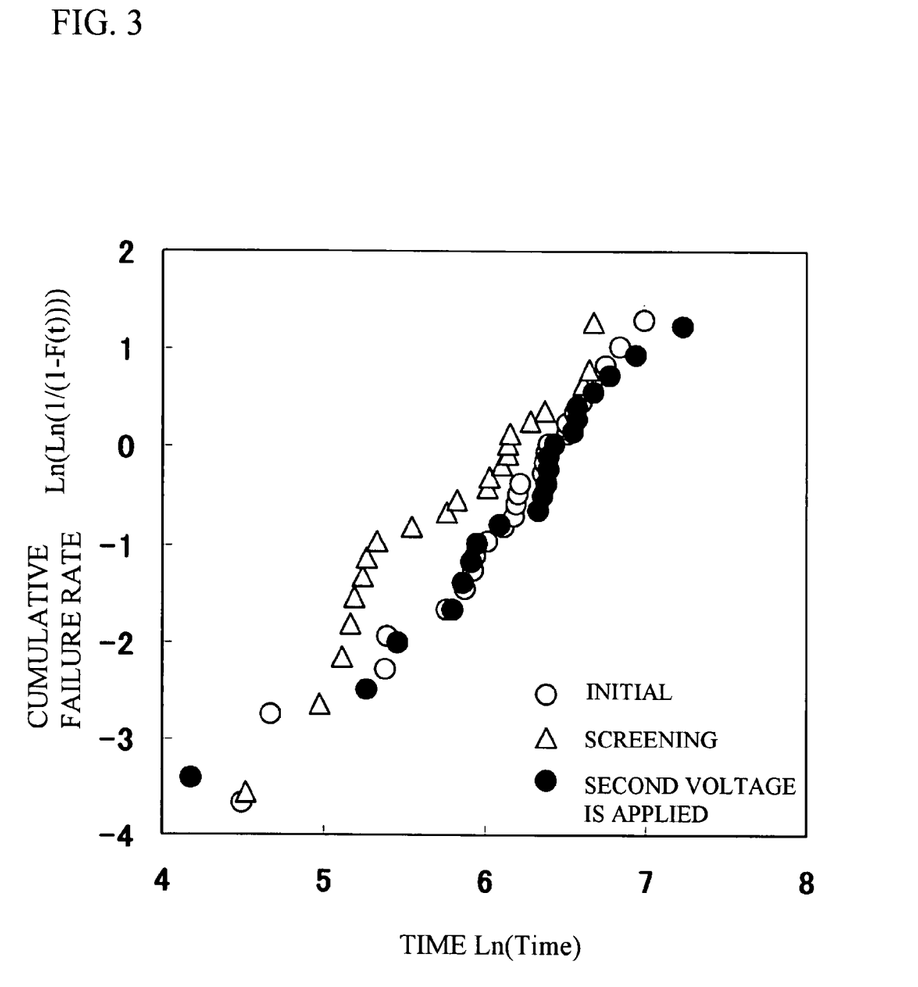
FIG. 3 illustrates a lifetime of a capacitor to which a second voltage is applied.

FIG. 3 illustrates a Weibull plot estimating a lifetime of the capacitor shown in FIG. 1. The lifetime of the capacitor is estimated at the room temperature with 63 V that is higher than the operating voltage. The capacitor is broken in a shorter time when the high voltage is applied to the capacitor. It is therefore possible to perform an acceleration test. A horizontal axis of FIG. 3 indicates a natural logarithm of a breaking time that is until the break down. The vertical axis of FIG. 3 illustrates a function of cumulative failure rate F(t), the "t" indicating the breaking time. A time indicating zero at the vertical axis is a property lifetime and has a cumulative failure rate F(t) of 63%. The property lifetime is also simply called a lifetime.

An open circle with "INITIAL" is a data of a life test of the capacitor that is not subjected to the screening test. An open triangle with "SCREENING" is a data of a life test where the first voltage of 63 V is applied to the capacitor for 200 seconds as the screening test and a voltage having a polarity same as that of the first voltage is applied to the capacitor. A filled circle with "SECOND VOLTAGE IS APPLIED" is a data of a life test where the second voltage of −63 V having a polarity opposite to the first polarity of the first voltage is applied to the capacitor for 200 seconds after the screening test and a voltage having a polarity same as that of the first voltage is applied to the capacitor.

The lifetime of the capacitor is reduced because of the screening test, when the data of "INITIAL" is compared to the data of "SCREENING". Application of the second voltage to the capacitor after the screening test elongates the lifetime of the capacitor, when the data of "SCREENING" is compared to the data of "SECOND VOLTAGE IS APPLIED". The lifetime after the second voltage application is approximately same as that of the initial capacitor. As mentioned above, it is possible to elongate the lifetime of the capacitor when the second voltage having a polarity opposite to that of the first voltage is applied to the capacitor (Step S14) after the screening test (Steps S10 and S11). It is possible to eliminate the initially defective capacitor with the screening test without the reduction of the lifetime of the normal capacitor (nondefective capacitor). The second voltage may be applied to the capacitor before the screening test (Steps S10 and S11). It is not necessary to apply the second voltage if the polarity of the first voltage is opposite to that of the operating voltage, because the lifetime is not reduced with the screening test.

The second polarity direct voltage (a second voltage) may be applied to the capacitor to which the first polarity direct voltage (a first voltage) is applied in the test process in FIG. 2 (Step S10) as a maintenance step (Step S14). The maintenance step (Step S14) may be performed before or after the operation of the capacitor. It is preferable that the maintenance step (Step S14) is performed for a time that is at least same as that for which the first voltage is applied in Step S10, in order to recover the lifetime of the capacitor. That is, it is preferable that the maintenance step is performed for a time more than that for which the first voltage is applied. Further, it is preferable that the capacitor is operated with alternative-current voltage, in order to elongate the lifetime of the capacitor, as described in a third embodiment.

Second Embodiment

Figure 4:
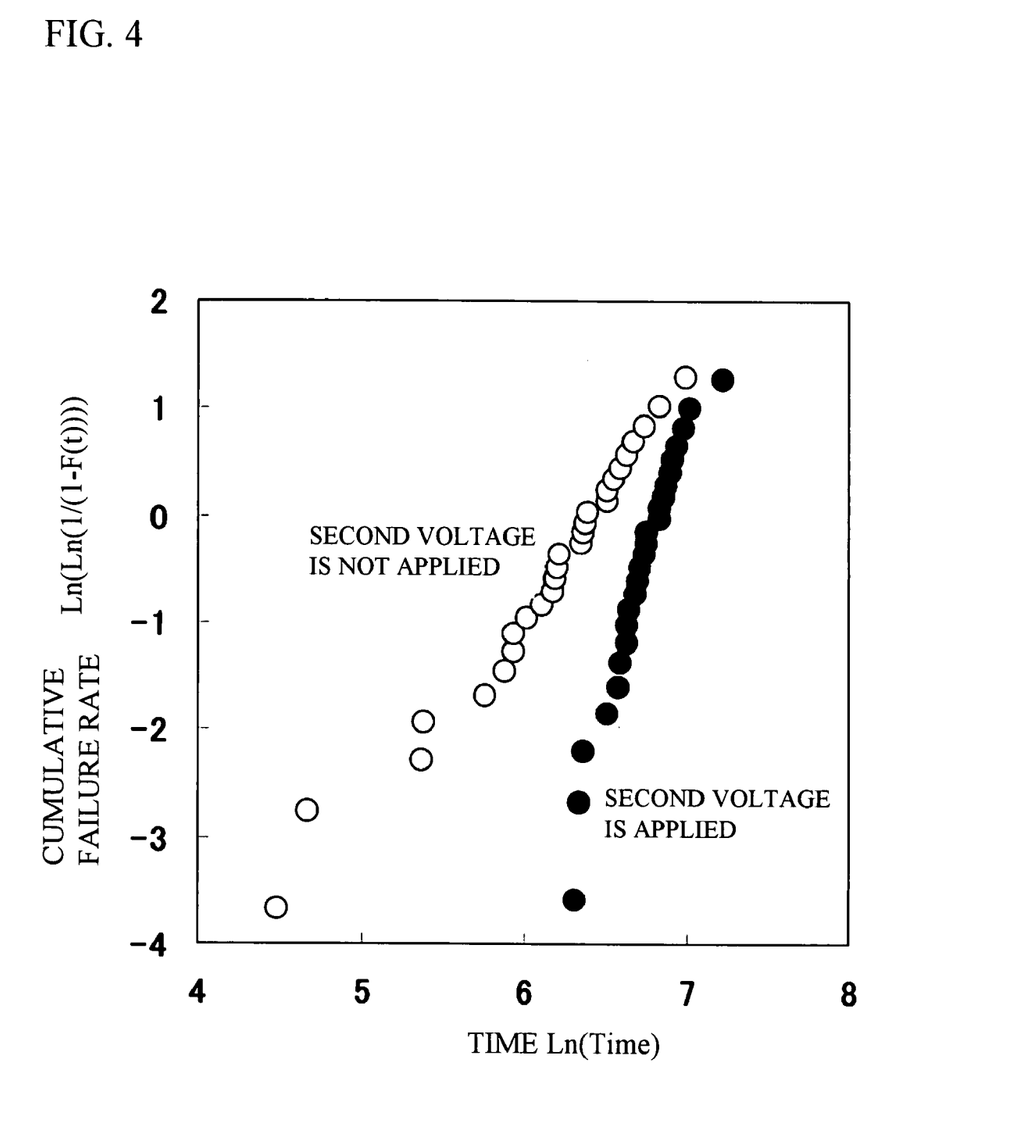
FIG. 4 illustrates a lifetime of a capacitor to which a second voltage is applied after a screening test.

A second embodiment is a case where the second voltage having a polarity opposite to that of the operating voltage is applied. FIG. 4 illustrates a result of a life test of the capacitor, similarly to FIG. 3 in the first embodiment. An open circle data with "SECOND VOLTAGE IS NOT APPLIED" indicates a data of a life test of the capacitor that is not subjected to the second voltage. A filled circle data with "SECOND VOLTAGE IS APPLIED" indicates a data of a life test of the capacitor that is subjected to the second voltage having a polarity opposite to that of the operating voltage (an applied voltage of an acceleration test in FIG. 4). The lifetime is elongated when the second voltage is applied. It is therefore possible to manufacture a capacitor having a long lifetime, if the capacitor is subjected to the second voltage having a polarity opposite to that of the operating voltage of the capacitor. The second voltage may be applied in a process of the screening test. In this case, it is possible to shorten the manufacturing process.

Figure 5:
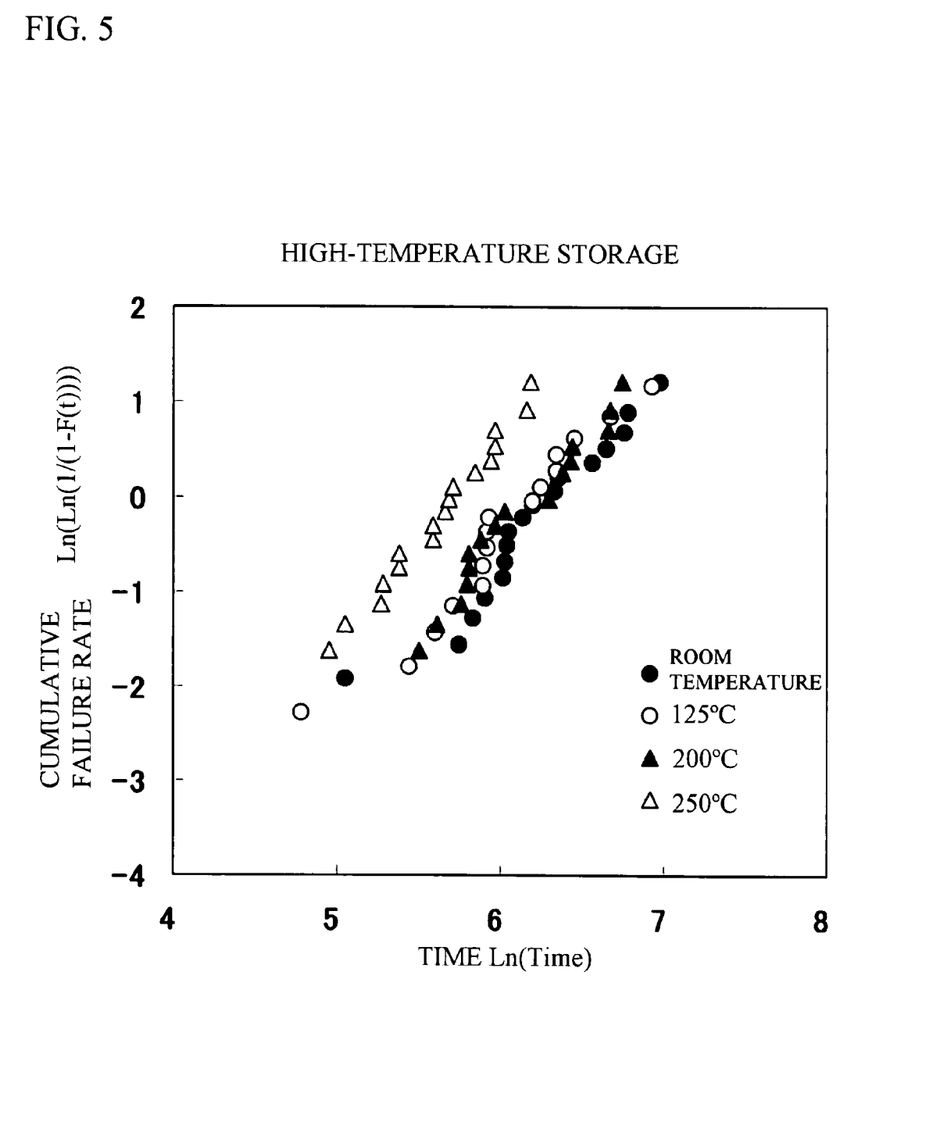
FIG. 5 illustrates a lifetime of a capacitor stored at high temperature.
Figure 6:
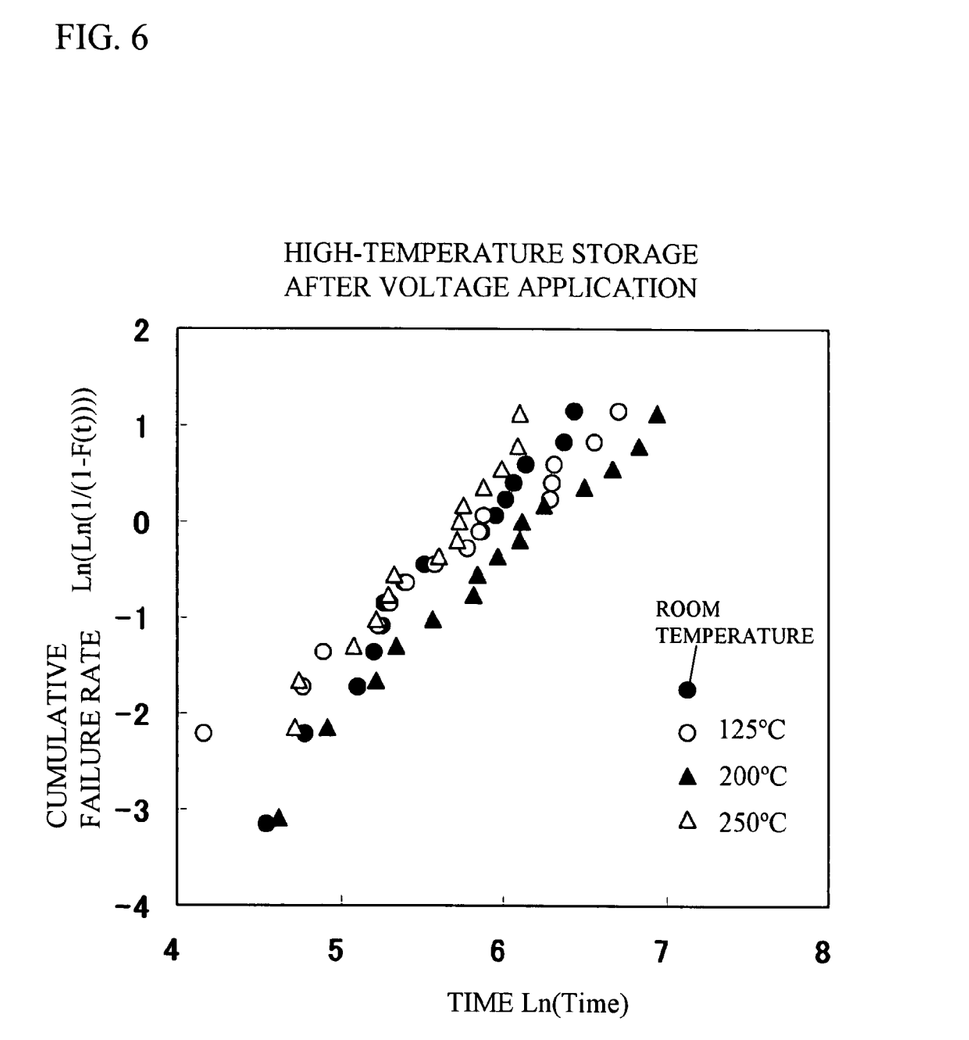
FIG. 6 illustrates a lifetime of a capacitor stored at high temperature after a voltage application.

Next, a description will be given of a preferable temperature range during the second voltage application in the first and the second embodiments. FIG. 5 illustrates a data of a life test of the capacitor after a high-temperature storage for six hours. FIG. 6 illustrates a data of the capacitor subjected to a lifetime test performed at room temperature after a voltage of 65 V (having a polarity same as that of the first voltage) is applied to the capacitor for 200 seconds at room temperature and the capacitor is stored at high temperature for six hours. In the life test shown in FIG. 5 and FIG. 6, the applied voltage (having a polarity same as that of the first voltage) is 65 V and the temperature is room temperature.

At first, as shown in FIG. 5, a description will be given of a lifetime of the capacitor stored at high temperature. The reduction of the lifetime is small at room temperature, at 125 degrees C. and at 200 degrees C. However, the lifetime is reduced after high-temperature storage at 250 degrees C. That is, the capacitor is degraded after storage or operation at a temperature more than 250 degrees C.

Next, as shown in FIG. 6, a description will be given of a lifetime of a capacitor that is stored at each of temperatures after a voltage of 65 V is applied to the capacitor for 200 seconds at room temperature. The lifetime is reduced after storage at room temperature, at 125 degrees C. and at 250 degrees C. In contrast, the lifetime after the storage at high temperature of 200 degrees C. is longer than that of the capacitors stored at other temperatures. This indicates that the capacitor is degraded because of the voltage application at room temperature and at 125 degrees C.

On the other hand, the influence of voltage application is reset because of temperature of 200 degrees C. And the condition of the capacitor is reset to that before the voltage application thereto. It is expected that the lifetime of the capacitor should be reduced after the storage at 200 degrees C. and at 250 degrees C. similarly to the case of room temperature and 125 degrees C., because a voltage having a polarity same as that of the first voltage is applied. However, the reduction of the lifetime (that is, the influence of the voltage application) is reset by the high-temperature storage at 200 degrees C. The influence of the voltage application is reset after the high-temperature storage at more than 200 degrees C. And, it is thought that the capacitor is degraded at temperature of 250 degrees C. as shown in FIG. 5, although the influence of the voltage application is reset because of the storage at 250 degrees C. As mentioned above, it is confirmed that temperature dependence is not observed and the influence of the voltage application is maintained at room temperature and at 125 degrees C. as shown in FIG. 6. And it is confirmed that the influence of the voltage application is reset at 200 degrees C. and a relationship between the voltage application and the lifetime is reduced.

It is preferable that the second voltage is applied to the capacitor at under 200 degrees C., more preferably less than 125 degrees C., so that the advantage of the voltage application is not reset, in order to obtain more advantage of the second voltage application to the capacitor. It is therefore possible to restrain the degradation of the capacitor without resetting the lifetime improvement advantage (advantage of the second voltage application) of the capacitor caused by the second voltage application.

Third Embodiment

Figure 7:
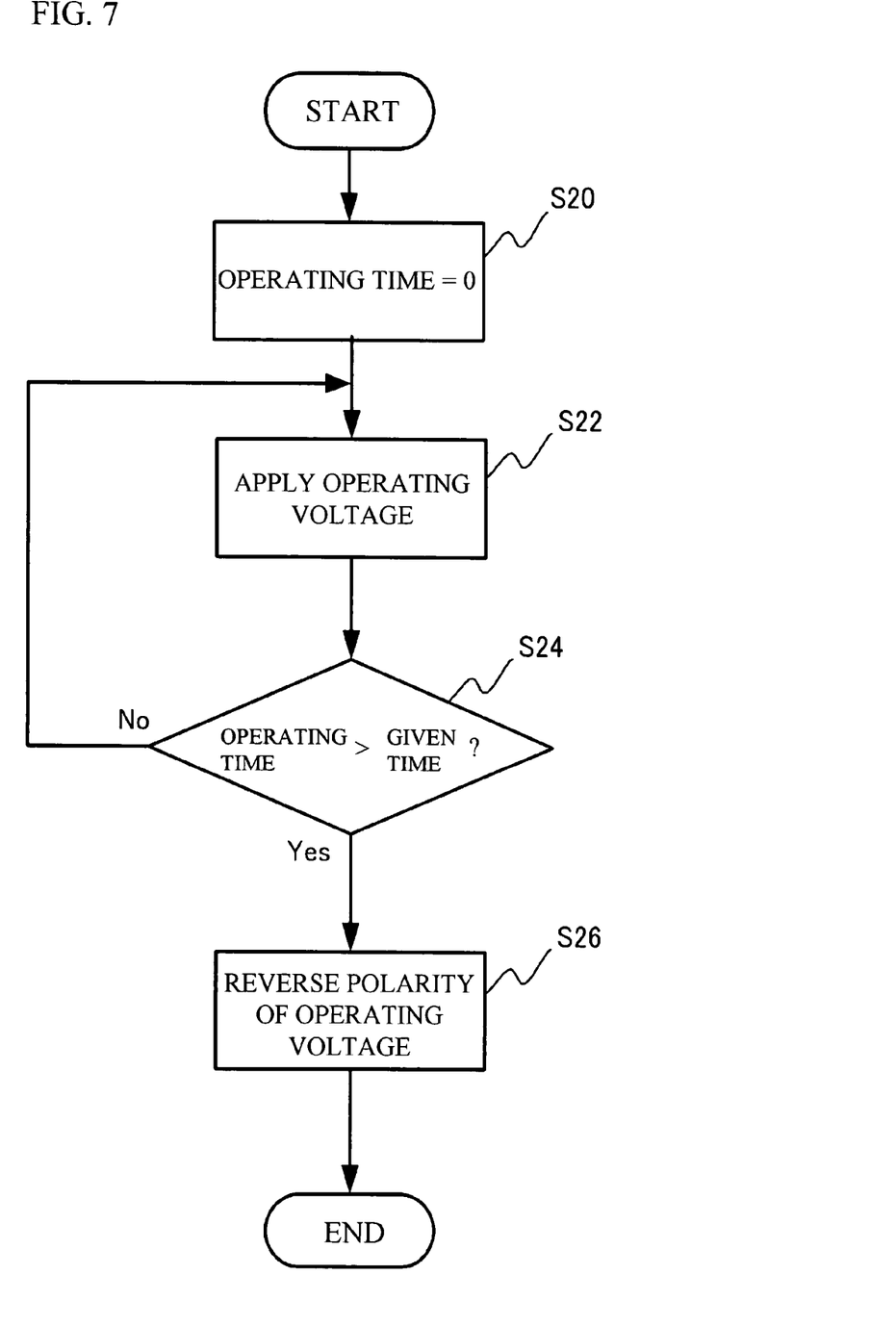
FIG. 7 illustrates a flow chart of a controlling method in accordance with a third embodiment.

A third embodiment is an example of a controlling method of an electronic device having a capacitor. As shown in FIG. 7, the operating time is set to be zero (Step S20). An operating voltage is applied to the capacitor in order to operate the capacitor (Step S22). It is determined whether the operating time is longer than a given time (Step S24). Here, the given time is set so that the capacitor may not be broken at the operating voltage. If it is determined "No" in Step S24, Step S22 is performed and the capacitor is operated. If it is determined "Yes" in Step S24, a polarity of the operating voltage is reversed (Step S26). The process is terminated. After that, the operating time is set to be zero (Step S20). And the operating voltage is applied to the capacitor (Step S22).

Figure 8:
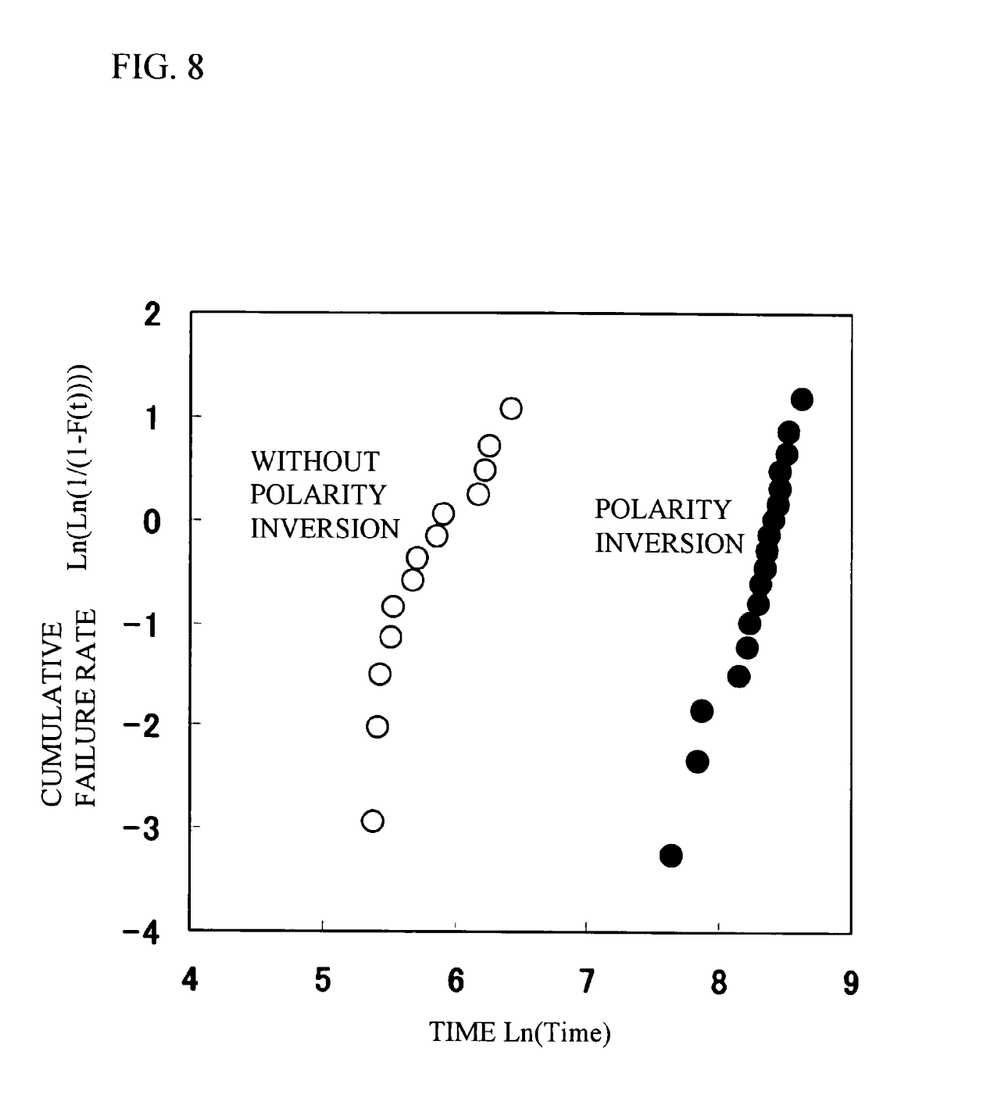
FIG. 8 illustrates a lifetime in a case where a polarity of an operating voltage is reversed.

An open circle with "WITHOUT POLARITY INVERSION" in FIG. 8 is a data of an acceleration test with a voltage of 63 V and without polarity inversion. A filled circle with "POLARITY INVERSION" is a data of a life test where the applied voltage is alternated between 63 V and −63 V every 10 seconds. As shown in FIG. 8, it is possible to elongate the lifetime of the capacitor by alternating the voltage for operating the capacitor.

Step S26, in which the polarity of the voltage is reversed, is performed according to the operating time of the capacitor similarly to Step S24. It is therefore possible to reverse the polarity of the voltage before the capacitor is broken.

The first through the third embodiments are an example of an MIM capacitor. However, the present invention may be applied to an MIS (Metal Insulator Semiconductor) capacitor or another. The capacitor dielectric layer 14 may be an insulating layer composed of nitrogen and silicon such as a silicon oxy-nitride layer, other than the silicon nitride (SiN) layer.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-258933 filed on Sep. 25, 2006, the entire disclosure of which is hereby incorporated by reference.

What is claimed is:

1. A manufacturing method of an electronic device comprising:
   applying a direct voltage having a first polarity to a capacitor that has an insulating layer including nitrogen and silicon as a capacitor dielectric layer;
   determining a nondefective capacitor and a defective capacitor by testing the capacitor to which the direct voltage having the first polarity is applied; and
   applying a direct voltage having a second polarity to the nondefective capacitor, the second polarity being opposite to the first polarity, wherein the capacitor dielectric layer is composed of SiN or SiON.

2. The method as claimed in claim 1, wherein the capacitor is an MIS capacitor or an MIM capacitor.

3. The method as claimed in claim 1, wherein the direct voltage having the second polarity is applied to the nondefective capacitor at a temperature under 200 degrees C.

4. A controlling method of an electronic device comprising a maintenance step of applying a direct voltage having a second polarity to a capacitor,
   the capacitor having an insulating layer including nitrogen and silicon as a capacitor dielectric layer,
   a test process step in which a direct voltage having a first polarity being applied to the capacitor, the second polarity being opposite to the first polarity, wherein the capacitor dielectric layer is composed of SiN or SiON.

5. The method as claimed in claim 4, wherein the maintenance step is performed at least for a time same as that for which the direct voltage having the first polarity is applied to the capacitor.

6. The method as claimed in claim 4, wherein the capacitor is used with an alternating-current voltage.

7. The method as claimed in claim 4, wherein the capacitor is an MIS capacitor or an MIM capacitor.

8. A manufacturing method of an electronic device comprising in order:
applying a direct voltage having a first polarity to a capacitor that has an insulating layer including nitrogen and silicon as a capacitor dielectric layer;
applying a direct voltage having a second polarity to the capacitor, the second polarity being opposite to the first polarity; and
testing the capacitor and determining a nondefective capacitor and a defective capacitor wherein the capacitor dielectric layer is composed of SiN or SiON.

* * * * *